United States Patent
Lin et al.

(10) Patent No.: US 10,923,212 B2
(45) Date of Patent: Feb. 16, 2021

(54) MEMORY CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); An-Cheng Liu, Taipei (TW); Yu-Cheng Hsu, Yilan County (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 99 days.

(21) Appl. No.: 16/251,105

(22) Filed: Jan. 18, 2019

(65) Prior Publication Data
US 2020/0168289 A1      May 28, 2020

(30) Foreign Application Priority Data

Nov. 23, 2018   (TW) .............................. 107141829 A

(51) Int. Cl.
  *G11C 29/50*   (2006.01)
  *G06F 3/06*    (2006.01)
  *G11C 29/12*   (2006.01)
  *G11C 29/14*   (2006.01)
  *G06F 11/10*   (2006.01)
  *G11C 29/52*   (2006.01)

(52) U.S. Cl.
  CPC ...... *G11C 29/50004* (2013.01); *G06F 3/0614* (2013.01); *G06F 3/0653* (2013.01); *G06F 3/0679* (2013.01); *G06F 11/1008* (2013.01); *G06F 11/1076* (2013.01); *G11C 29/1201* (2013.01); *G11C 29/14* (2013.01); *G11C 29/52* (2013.01); *G11C 2029/5004* (2013.01)

(58) Field of Classification Search
  CPC .......... G11C 29/50004; G11C 29/1201; G11C 2029/5004; G11C 29/52; G11C 29/14; G06F 11/1076; G06F 11/1008; G06F 3/0614; G06F 3/0653; G06F 3/0679
  USPC ....... 714/721, 718, 723, 759, 763, 768, 773, 714/800, 6.2, 42, 54; 365/200, 201, 365/185.09, 185.24, 185.33
  See application file for complete search history.

(56) References Cited

U.S. PATENT DOCUMENTS 8,254,167 B2 *  8/2012  Patapoutian ........ G11C 11/5628
                                             365/185.03
8,499,217 B2 *  7/2013  Song .................. G06F 11/1012
                                             365/185.09

(Continued)

OTHER PUBLICATIONS

"Office Action of Taiwan Counterpart Application," dated Mar. 20, 2019, p. 1-p. 6.

*Primary Examiner* — John J Tabone, Jr.
(74) *Attorney, Agent, or Firm* — JCIPRNET

(57) ABSTRACT

A memory control method for a rewritable non-volatile memory module including a plurality of physical units is provided according to an exemplary embodiment of the disclosure. The method includes: reading first data from a first physical unit of a rewritable non-volatile memory module; decoding the first data by a decoding circuit; updating reliability information according to the decoded first data; reading second data from a second physical unit of the rewritable non-volatile memory module; and decoding the second data by the decoding circuit according to the updated reliability information.

24 Claims, 7 Drawing Sheets

(56) References Cited

U.S. PATENT DOCUMENTS

| | | | | |
|---|---|---|---|---|
| 8,576,625 B1* | 11/2013 | Yang | ............... | G11C 16/26 |
| | | | | 365/185.09 |
| 8,856,615 B1* | 10/2014 | Krishnan | .......... | H03M 13/2957 |
| | | | | 714/718 |
| 2011/0280068 A1* | 11/2011 | Patapoutian | ........ | G11C 11/5628 |
| | | | | 365/185.03 |
| 2012/0213001 A1* | 8/2012 | Yang | ................ | G06F 11/1048 |
| | | | | 365/185.2 |
| 2012/0297273 A1* | 11/2012 | Sakaue | ............. | H03M 13/1188 |
| | | | | 714/773 |
| 2014/0068379 A1* | 3/2014 | Sakaue | ............. | G06F 11/1012 |
| | | | | 714/764 |
| 2015/0113318 A1* | 4/2015 | Wu | ................. | G06F 11/1008 |
| | | | | 714/6.11 |
| 2016/0098316 A1 | 4/2016 | Lin et al. | | |
| 2016/0119105 A1* | 4/2016 | Jiang | ............... | H04L 1/1819 |
| | | | | 370/329 |
| 2017/0085276 A1* | 3/2017 | Prabhakar | ........... | G06F 11/1012 |
| 2017/0091028 A1* | 3/2017 | Golan | ................ | G11C 29/028 |
| 2017/0206130 A1* | 7/2017 | Hsiao | ............... | H03M 13/6325 |
| 2018/0293131 A1* | 10/2018 | Lin | .................... | G06F 11/1072 |
| 2019/0318791 A1* | 10/2019 | Lin | ...................... | G11C 16/26 |

* cited by examiner

MEMORY CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 107141829, filed on Nov. 23, 2018. The entirety of the above-mentioned patent application is hereby incorporated by reference herein and made a part of this specification.

BACKGROUND

Technical Field

The disclosure relates to a memory control technology, and more particularly to a memory control method, a memory storage device, and a memory control circuit unit.

Description of Related Art

Digital cameras, mobile phones, and MP3 players have been growing very quickly in recent years, causing consumer demand for storage media to increase rapidly. Since a rewritable non-volatile memory module (e.g. a flash memory) has characteristics such as data non-volatile, power saving, small size, no mechanical structure, etc., the rewritable non-volatile memory module is very suitable to be built in the various portable multimedia devices exemplified above.

The data read from the memory storage device may contain error bits based on various factors. Therefore, before transferring data to the host system, the read data can be decoded to try to correct the error bits in the read data. In general, after successfully decoding a certain read data, the successfully decoded data may be temporarily stored in the buffer memory. After this data is transferred to the host system, this data is then removed from the buffer memory. In other words, in the conventional decoding process, the decoded data is not used for further analysis in an attempt to improve the decoding efficiency in the future. After a period of use, the memory storage device may not be able to continue to use because the data decoding efficiency is too poor.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a memory control method, a memory storage device, and a memory control circuit unit, which are capable of improving a decoding efficiency of the memory storage device and/or extending the lifetime of the memory storage device.

A memory control method for a rewritable non-volatile memory module which comprises a plurality of physical units is provided according to an exemplary embodiment of the disclosure. The memory control method comprises: reading first data from a first physical unit among the physical units; decoding the first data by a decoding circuit; updating reliability information according to the decoded first data; reading second data from a second physical unit among the physical units; and decoding the second data by the decoding circuit according to the updated reliability information.

A memory storage device which comprises a connection interface unit, a rewritable non-volatile memory module and a memory control circuit unit is provided according to an exemplary embodiment of the disclosure. The connection interface unit is configured to connect a host system. The rewritable non-volatile memory module comprises a plurality of physical units. The memory control circuit unit is coupled to the connection interface unit and the rewritable non-volatile memory module. The memory control circuit unit is configured to issue a first read command sequence which instructs a reading of first data from a first physical unit among the physical units. The memory control circuit unit is further configured to decode the first data. The memory control circuit unit is further configured to update reliability information according to the decoded first data. The memory control circuit unit is further configured to issue a second read command sequence which instructs a reading of second data from a second physical unit among the physical units. The memory control circuit unit is further configured to decode the second data according to the updated reliability information.

A memory control circuit unit for controlling a rewritable non-volatile memory module which comprises a plurality of physical units is provided according to an exemplary embodiment of the disclosure. The memory control circuit unit comprise a host interface, a memory interface, a decoding circuit and a memory management circuit. The host interface is configured to couple to a host system. The memory interface is configured to couple to the rewritable non-volatile memory module. The memory management circuit is coupled to the host interface, the memory interface and the decoding circuit. The memory management circuit is configured to issue a first read command sequence which instructs a reading of first data from a first physical unit among the physical units. The decoding circuit is configured to decode the first data. The memory management circuit is further configured to update reliability information according to the decoded first data. The memory management circuit is further configured to issue a second read command sequence which instructs a reading of second data from a second physical unit among the physical units. The decoding circuit is further configured to decode the second data according to the updated reliability information.

Based on the above, after the first data is read from the first physical unit, the first data may be decoded, and the reliability information may be updated according to the decoded first data. After the second data is read from the second physical unit, the second data may be decoded according to the updated reliability information. Accordingly, a decoding efficiency of a memory storage device may be improved and/or a lifetime of a memory storage device may be extended.

To make the aforementioned and other features of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and may be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
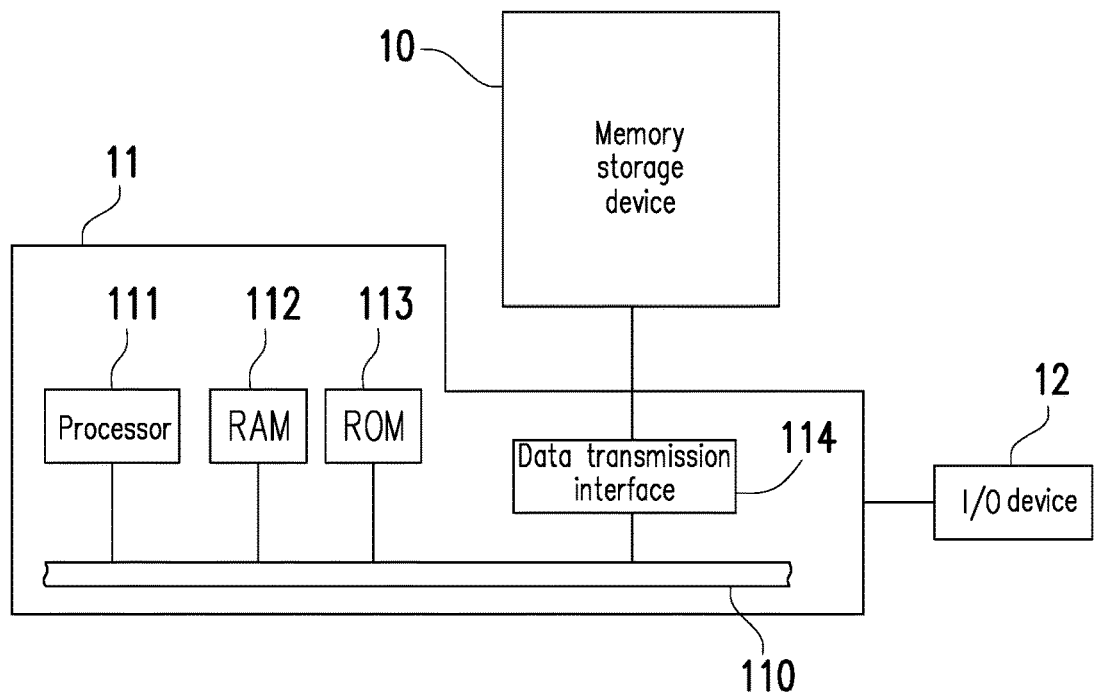
FIG. 1 is a schematic diagram of a host system, a memory storage device, and an input/output (I/O) device according to an exemplary embodiment of the disclosure.

Reference may now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" may be used interchangeably herein.

Generally, a memory storage device (also referred to as a memory storage system) includes a rewritable non-volatile memory module and a controller (also referred to as a control circuit). The memory storage device is normally used together with a host system, allowing the host system to write data to the memory storage device or read data from the memory storage device.

Figure 2:
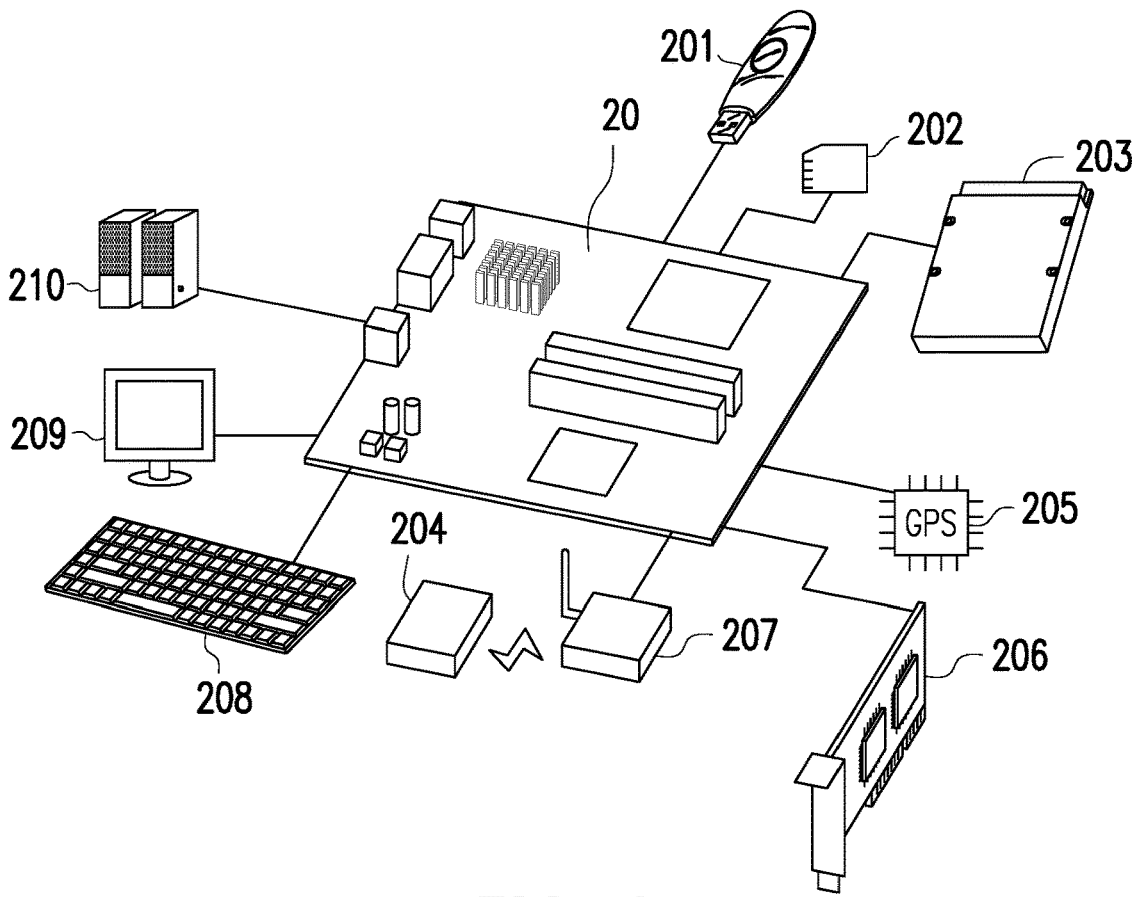
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Please refer to FIG. 1 and FIG. 2, a host system 11 normally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the exemplary embodiment, the host system 11 is coupled to a memory storage device 10 through the data transmission interface 114. For example, the host system 11 may store data to the memory storage device 10 or read data from the memory storage device 10 via the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In the exemplary embodiment, the processor 111, the random access memory 112, the read-only memory 113, and the data transmission interface 114 may be disposed on a motherboard 20 of the host system 11. The number of data transmission interfaces 114 may be one or more. The motherboard 20 may be coupled to the memory storage device 10 via a wired or a wireless method through the data transmission interface 114. The memory storage device 10 may be, for example, a flash drive 201, a memory card 202, a Solid State Drive (SSD) 203, or a wireless memory storage device 204. The wireless memory storage device 204 may be, for example, a Near Field Communication (NFC) memory storage device, a wireless fidelity (WiFi) memory storage device, a Bluetooth memory storage device, a Bluetooth low energy (BLE) memory storage device (e.g. iBeacon), or other memory storage devices based on various types of wireless communication technologies. In addition, the motherboard 20 may also be coupled to a Global Positioning System (GPS) module 205, a network interface card 206, a wireless transmission device 207, a keyboard 208, a screen 209, a speaker 210, or other types of I/O devices through the system bus 110. For example, in an exemplary embodiment, the motherboard 20 may access the wireless memory storage device 204 through the wireless transmission device 207.

Figure 3:
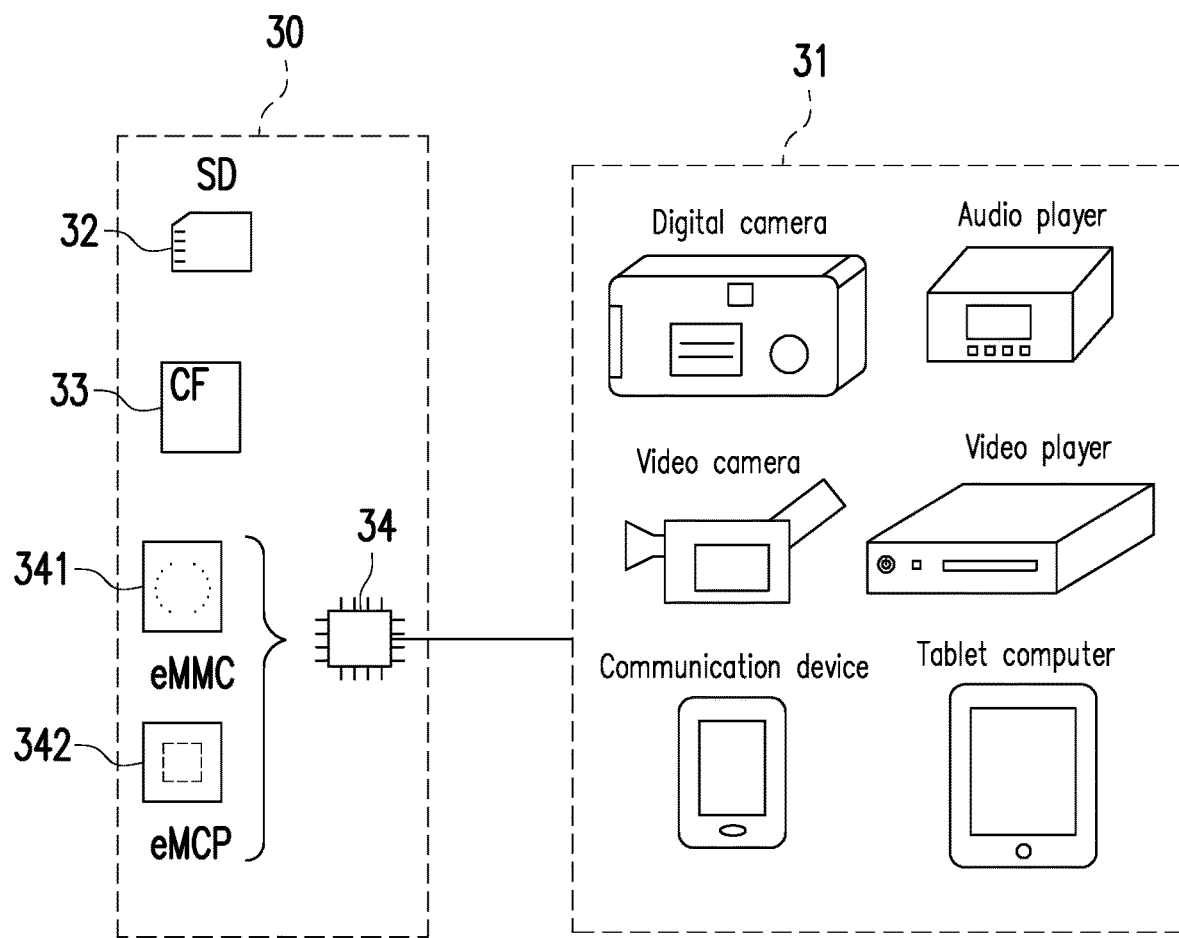
FIG. 3 is a schematic diagram of a host system and a memory storage device according to another exemplary embodiment of the disclosure.

In an exemplary embodiment, the host system mentioned may be any system that may substantially work with a memory storage device to store data. Although in the exemplary embodiments above, a computer system is used as the host system for illustration, FIG. 3 is a schematic diagram of a host system and a memory storage device according to another exemplary embodiment of the disclosure. Please refer to FIG. 3, in another exemplary embodiment, a host system 31 may also be a digital camera, a video camera, a communication device, an audio player, a video player, a tablet computer, or other systems. A memory storage device 30 may be a Secure Digital (SD) card 32, a Compact Flash (CF) card 33, an embedded storage device 34, or other types of non-volatile memory storage devices used by the host system 31. The embedded storage device 34 includes an embedded Multi Media Card (eMMC) 341, and/or an embedded Multi Chip Package (eMCP) storage device 342, or various types of embedded storage devices which directly couple a memory module onto a substrate of a host system.

Figure 4:
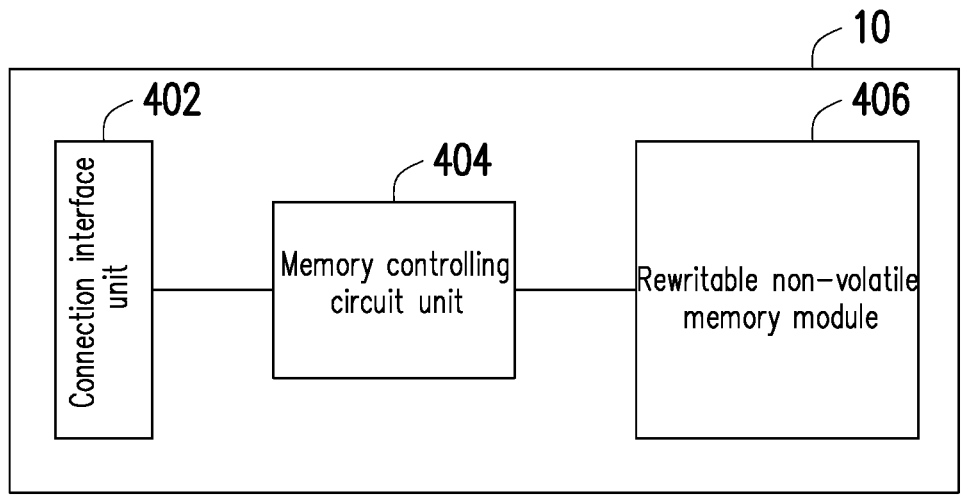
FIG. 4 is a functional block diagram of a memory storage device according to an exemplary embodiment of the disclosure.

FIG. 4 is a functional block diagram of a memory storage device according to an exemplary embodiment of the disclosure.

Please refer to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connection interface unit 402. In the exemplary embodiment, the connection interface unit 402 is compatible with the Serial Advanced Technology Attachment (SATA) standard. However, it must be understood that the disclosure is not limited thereto. The connection interface unit 402 may also be compatible with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged in one chip with the memory control circuit unit 404 or the connection interface unit 402 may be disposed outside a chip containing the memory control circuit unit 404.

The memory control circuit unit 404 is configured to perform multiple logic gates or control commands implemented using a hardware type or a firmware type and execute operations such as writing, reading, and erasing of data in the rewritable non-volatile memory module 406 according to the command of the host system 11.

The rewritable non-volatile memory module 406 is coupled to the memory control circuit unit 404 and is configured to store data written by the host system 11. The rewritable non-volatile memory module 406 may be a Single Level Cell (SLC) NAND flash memory module (i.e., a flash memory module which stores 1-bit in one memory cell), a Multi Level Cell (MLC) NAND flash memory module (i.e., a flash memory module which stores 2-bits in one memory cell), a Triple Level Cell (TLC) NAND flash memory module (i.e., a flash memory module which stores 3-bits in one memory cell), a Quad Level Cell (QLC) NAND flash memory module (i.e., a flash memory module which stores 4-bits in one memory cell), other flash memory modules, or other memory modules with the same characteristic.

Each memory cell of the rewritable non-volatile memory modules 406 stores one or more bits based on a change of voltage (also referred to as a threshold voltage hereinafter). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data into the memory cell" or "programming the memory cell". As the threshold voltage changes, each memory cell of the rewritable non-volatile memory module 406 has multiple storage states. Through applying a read voltage, the storage state to which a memory cell belongs may be determined, thereby obtaining one or more bits stored by the memory cell.

In the exemplary embodiment, the memory cells of the rewritable non-volatile memory module 406 constitute multiple physical programming units, and the physical programming units constitute multiple physical erasing units. Specifically, the memory cells on the same word line form one or more physical programming units. If each memory cell may store two bits or more than 2 bits, then the physical programming units on the same word line may at least be classified into a lower physical programming unit and an upper physical programming unit. For example, a Least Significant Bit (LSB) of a memory cell belongs to the lower physical programming unit while a Most Significant Bit (MSB) of a memory cell belongs to the upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the exemplary embodiment, the physical programming unit is the smallest unit of programming. That is, the physical programming unit is the smallest unit of write data. For example, the physical programming unit is a physical page or a physical sector. If the physical programming unit is a physical page, then the physical programming units normally include a data bit region and a redundancy bit region. The data bit region includes multiple physical sectors for storing user data while the redundancy bit region is for storing system data (e.g. management data such as error correction codes, etc.). In the exemplary embodiment, the data bit region contains 32 physical sectors, and the size of one physical sector is 512 bytes (B). However, in other exemplary embodiments, a data bit region may also contain 8, 16, a higher number, or a lower number of physical sectors, and the size of each physical sector may also be larger or smaller. On the other hand, the physical erasing unit is the smallest unit of erase. That is, each physical erasing unit includes the smallest number of memory cells erased together. For example, the physical erasing unit is a physical block.

Figure 5:
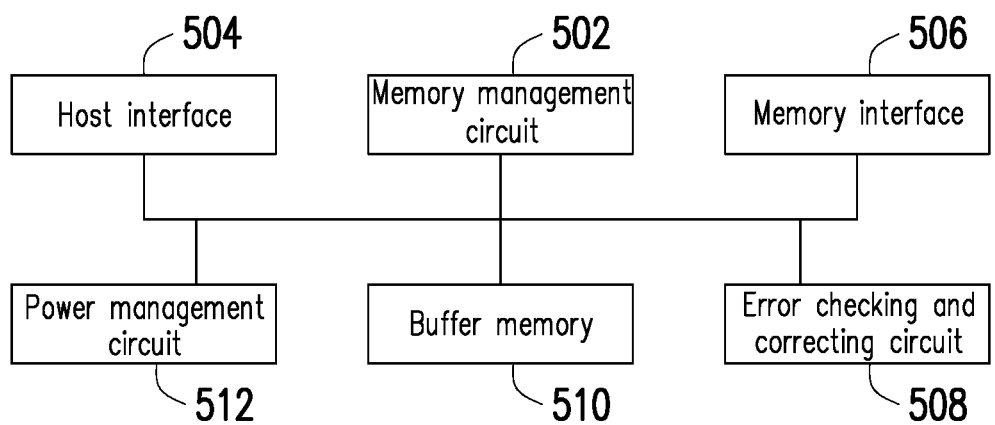
FIG. 5 is a functional block diagram of a memory control circuit unit according to an exemplary embodiment of the disclosure.

FIG. 5 is a functional block diagram of a memory control circuit unit according to an exemplary embodiment of the disclosure.

Please refer to FIG. 5, the memory control circuit unit 404 includes a memory management circuit 502, a host interface 504, a memory interface 506 and an error checking and correcting circuit (ECCC) 508.

The memory management circuit 502 is configured to control the overall operation of the memory control circuit unit 404. Specifically, the memory management circuit 502 has multiple control commands. When the memory storage device 10 operates, the control commands are performed to carry out operations such as writing, reading, and erasing of data. The illustration of operation of the memory management circuit 502 below may be equivalent to the illustration of operation of the memory control circuit unit 404.

In the exemplary embodiment, the control commands of the memory management circuit 502 are implemented using a firmware form. For example, the memory management circuit 502 has a microprocessor unit (not shown) and a read only memory (not shown), and the control commands are burnt into the read only memory. When the memory storage device 10 operates, the control commands are performed by the microprocessor unit to carry out operations such as writing, reading, and erasing of data.

In another exemplary embodiment, the control commands of the memory management circuit 502 may also be stored in a specific area of the rewritable non-volatile memory module 406 (e.g. a system area in the memory module dedicated to storage of system data) as a program code. In addition, the memory management circuit 502 has a microprocessor unit (not shown), a read only memory (not shown), and a random access memory (not shown). In particular, the read only memory has a boot code. When the memory control circuit unit 404 is enabled, the microprocessor unit first performs the boot code to load the control commands stored in the rewritable non-volatile memory module into the random access memory of the memory management circuit 502. Then, the microprocessor unit may run the control commands to carry out operations such as writing, reading, and erasing of data.

In addition, in another exemplary embodiment, the control commands of the memory management circuit 502 may also be implemented using a hardware form. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage memory cells of the rewritable non-volatile memory module 406 or a group thereof. The memory write circuit is configured to issue a write command sequence to the rewritable non-volatile memory module 406 to write data into the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. The write command sequence, the read command sequence, and the erase command sequence may each include one or more program code or command code, and are for instructing the rewritable non-volatile memory module 406 to perform the corresponding write, read, erase, etc. operations. In an exemplary embodiment, the memory management circuit 502 may also issue other types of command sequences to the rewritable non-volatile memory module 406 to instruct performance of the corresponding operation.

The host interface 504 is coupled to the memory management circuit 502. The memory management circuit 502 may communicate with the host system 11 through the host interfac4 504. The host interface 504 is configured to receive and identify commands and data transmitted by the host system 11. For example, the commands and the data transmitted by the host system 11 are transmitted to the memory management circuit 502 through the host interface 504. Furthermore, the memory management circuit 502 may transmit data to the host system 11 through the host interface 504. In the exemplary embodiment, the host interface 504 is compatible with the SATA standard. However, it must be understood that the disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other standards suitable for data transmission.

The memory interface 506 is coupled to the memory management circuit 502 and is configured to access the rewritable non-volatile memory module 406. In other words, the data to be written to the rewritable non-volatile memory module 406 is converted to a format acceptable to the rewritable non-volatile memory module 406 via the memory interface 506. Specifically, if the memory management circuit 502 is to access the rewritable non-volatile memory module 406, the memory interface 506 may transmit a corresponding command sequence. For example, the command sequences may include a write command sequence instructing a writing of data, a read command sequence instructing a reading of data, an erase command sequence instructing an erasing of data, and corresponding command sequences for instructing various types of memory operations (e.g. changing read voltage level, performing garbage collection operation, etc.). The command sequences are generated, for example, by the memory management circuit 502 and transmitted to the rewritable non-volatile memory module 406 through the memory interface 506. The command sequences may include one or more signals, or data on the system bus. The signals or data may include command codes or program codes. For example, in the read command sequence, information such as a read identification code, a memory address, etc. are included.

The error checking and correcting circuit 508 is coupled to the memory management circuit 502 and is configured to perform error checking and correcting operations to ensure correctness of data. Specifically, when the memory management circuit 502 receives a write command from the host system 11, the error checking and correcting circuit 508 may generate an error correcting code (ECC) and/or an error detecting code (EDC) for the data corresponding to the write command. The memory management circuit 502 may write the data corresponding to the write command and the corresponding error correcting code and/or error detecting code into the rewritable non-volatile memory module 406. Then, when the memory management circuit 502 reads data from the rewritable non-volatile memory module 406, the error correcting code and/or the error detecting code corresponding to the data are read simultaneously. The error checking and correcting circuit 508 may perform an error checking and correcting operation to the read data based on the error correcting code and/or error detecting code.

In an exemplary embodiment, the memory control circuit unit 404 further includes a buffer memory 510 and a power management circuit 512.

The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control the power of the memory storage device 10.

In an exemplary embodiment, the rewritable non-volatile memory module 406 of FIG. 4 is also referred to as a flash memory module, the memory control circuit unit 404 of FIG. 4 is also referred to as a flash memory controller configured to control the flash memory module, and/or the memory management circuit 502 of FIG. 5 is also referred to as a flash memory management circuit.

Figure 6:
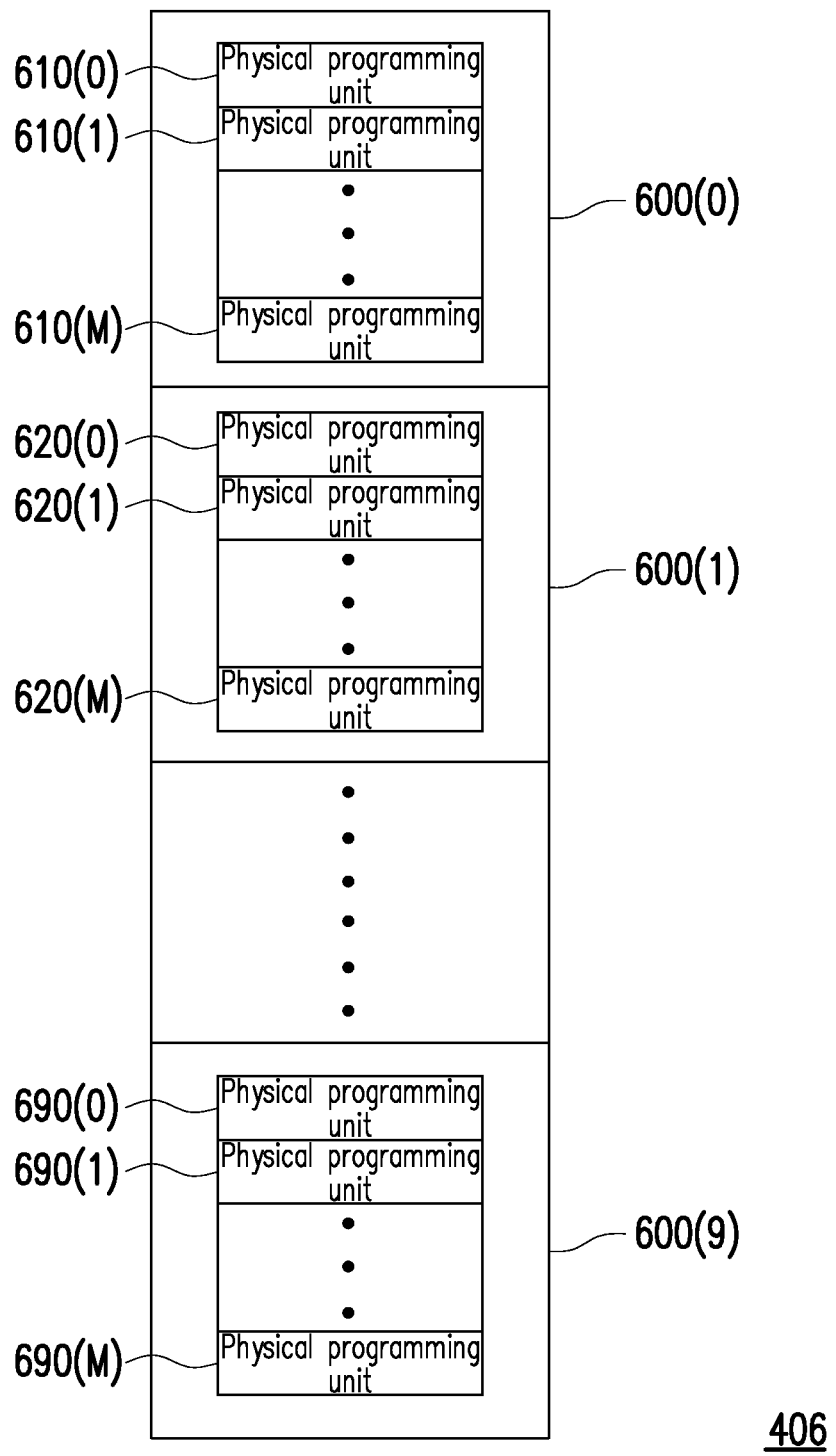
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure.

Please refer to FIG. 6, in the exemplary embodiment, it is assumed that the rewritable non-volatile memory module 406 includes 10 physical erasing units 600(0)-600(9), and each physical erasing unit includes (M+1) physical programming units (also referred to as physical units). For example, the physical erasing unit 600(0) may include physical programming units 610(0)-610(M), the physical erasing unit 600(1) may include physical programming units 620(0)-620(M), and the physical erasing unit 600(9) may include physical programming units 690(0)-690(M). However, in another exemplary embodiment, the rewritable non-volatile memory module 406 may include more or less physical erasing units, and/or one physical erasing unit may include more or less physical programming units.

In an exemplary embodiment, the memory management circuit 502 may logically group the physical units of the rewritable non-volatile memory module 406 into a storage area and a replacement area. The physical units in the storage area are configured to store data, and the physical units in the replacement area are configured to replace damaged physical units in the storage area. For example, if data read from one specific physical unit includes too many errors and these errors cannot be corrected, the specific physical unit is regarded as a damaged physical unit. It is noted that, if there are no available physical erasing units in the replacement area, the memory management circuit 502 may declare the memory storage device 10 as in a write protect state so data can no longer be written thereto.

In an exemplary embodiment, the memory management circuit 502 may assign logical units for mapping to the physical units in the storage area. For example, one logical unit may refer to one logical address, one logical programming unit, one logical erasing unit or a composition of a plurality of continuous or discontinuous logical addresses. In addition, one logical unit may be mapped to one or more physical units.

In an exemplary embodiment, the memory management circuit 502 may record a mapping relation (also referred to as a logical-physical address mapping relation) between the logical units and the physical units into at least one logical-physical address mapping table. When the host system 11 intends to read data from the memory storage device 10 or write data into the memory storage device 10, the memory management circuit 502 may perform a data accessing operation on the memory storage device 10 according to the logical-physical address mapping table.

The error checking and correcting circuit 508 may include one or more decoding circuits. In the exemplary embodiment, the error checking and correcting circuit 508 uses a low-density parity-check (LDPC) code. However, in another exemplary embodiment, the error checking and correcting circuit 508 may use a BCH code, a convolutional code, a turbo code, or the like.

It is noted that in the following description, some terms may be replaced with corresponding abbreviations for ease of reading (see Table 1).

TABLE 1

| rewritable non-volatile memory module | RNVM module |
|---|---|
| memory management circuit | MMC |
| error checking and correcting circuit | ECCC |
| physical unit | PU |
| physical programming unit | PPU |
| physical erasing unit | PEU |

In the LDPC code, a valid codeword is defined by using a parity-check matrix. In the following, the parity-check matrix is labeled as a matrix H, and a codeword is labeled as CW. According to an equation (1) in the following, if a result of multiplication of the parity-check matrix H by the codeword CW is zero vector, then the codeword CW is a valid codeword, wherein an operator $\otimes$ represents a mod 2 matrix multiplication. In other words, a null space of the matrix H includes all the valid codewords. However, the disclosure does not intend to limit contents of the codeword CW. For instance, the codeword CW may also include the ECC or the EDC generated by any algorithm.

$$H \otimes CW^T = 0 \tag{1}$$

In the equation (1), a dimension of the matrix H is k-by-n, and a dimension of the codeword CW is 1-by-n, where k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n–k), and a dimension of the vector P is 1-by-k. Hereinafter, the message bits and the parity bits are collectively referred to as data bits. In other words, the codeword CW includes n data bits, in which a length of the message bits is (n–k) bits, a length of the parity bits is k bits, and a code rate of the codeword CW is (n–k)/n.

Generally, a generation matrix (labeled as G hereinafter) is used during encoding, so that an equation (2) below may be satisfied by arbitrary values of the vector M. In the equation (2), a dimension of the generation matrix G is (n–k)-by-n.

$$M \otimes G = [M \ P] = CW \tag{2}$$

The codeword CW generated by the equation (2) is a valid codeword. Therefore, when the equation (2) is substituted into the equation (1), an equation (3) below may be obtained accordingly.

$$H \otimes G^T \otimes M^T = 0 \tag{3}$$

Since the vector M may be arbitrary vectors, an equation (4) below is definitely satisfied. In other words, after the parity check matrix H is decided, the corresponding generation matrix G may also be decided.

$$H \otimes G^T = 0 \tag{4}$$

When decoding the codeword CW, a parity check operation is firstly executed on the data bits in the codeword. For example, the parity check matrix H may be multiplied by the codeword CW to generate a vector (the vector is labeled as S in the following, as shown in an equation (5) below). If the vector S is the zero vector, the codeword CW may be directly output. If the vector S is not the zero vector, it is indicated that the codeword CW is not a valid codeword.

$$H \otimes CW^T = S \tag{5}$$

In the equation (5), a dimension of the vector S is k-by-1, in which each element is also referred to as a syndrome. If the codeword CW is not a valid codeword, the ECCC 508 may execute a decoding operation for attempting to correct the error (i.e., the error bit) in the codeword CW.

Figure 7:
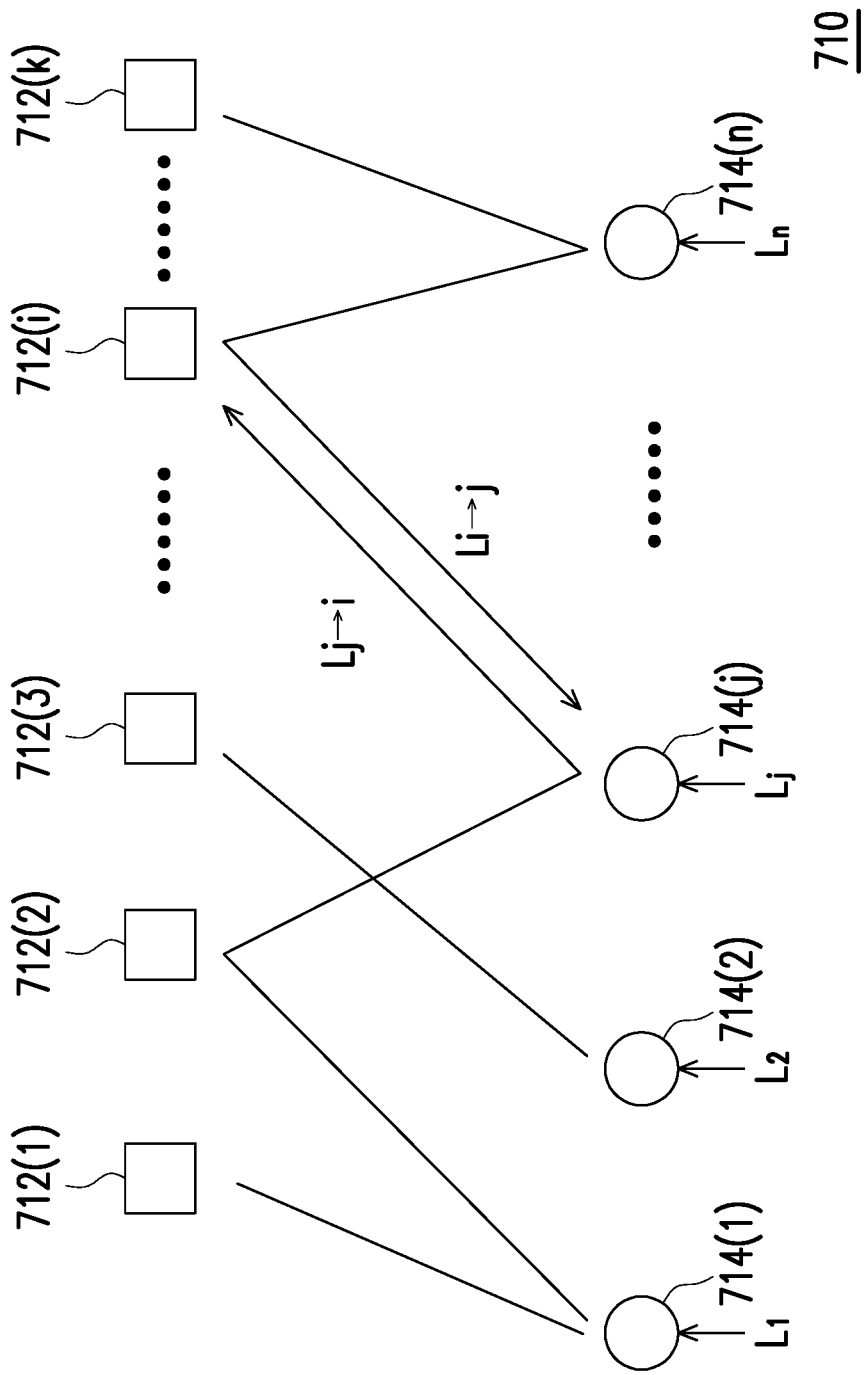
FIG. 7 is a schematic view of a parity check matrix according to an exemplary embodiment of the disclosure.

FIG. 7 is a schematic view illustrating a parity check matrix according to an exemplary embodiment of the disclosure. Referring to FIG. 7, in the exemplary embodiment, the parity-check matrix H may be represented as a bipartite graph 710. The bipartite graph 710 includes parity nodes 712(1)-712(k) and message nodes 714(1)-714(n). Each of the parity nodes 712(1)-712(k) corresponds to a syndrome, and each of the message nodes 714(1)-714(n) corresponds to a data bit. Corresponding relationships between the data bits and the syndromes (i.e., connections between the message nodes 714(1)-714(n) and the parity nodes 712(1)-712(k)) are generated according to the parity-check matrix. For example, if an element at the $i^{th}$ row and the $j^{th}$ column of the parity-check matrix is 1, the $i^{th}$ parity node 712(i) is connected to the $j^{th}$ message node 714(j), where i and j are positive integers.

When the MMC 502 reads n data bits (to form a codeword) from the RNVM module 406, the MMC 502 may also obtain reliability information (also referred to as channel reliability information) corresponding to each data bit. The reliability information represents a probability (also referred to as confidence level) that the corresponding data bit is decoded into the bit "1" or "0". In the bipartite graph 710, the message nodes 714(1)-714(n) also receive the corresponding reliability information. For example, the message node 714(1) may receive reliability information $L_1$ corresponding to the first data bit, and the message node 714(j) may receive reliability information $L_j$ corresponding to the $j^{th}$ data bit.

The ECCC 508 may perform the decoding operation based on the structure of the bipartite graph 710 and the reliability information $L_1$ to $L_n$. For example, the decoding operation includes iteration decoding. In the iteration decoding, the message nodes 714(1)-714(n) may calculate the reliability information for the parity nodes 712(1)-712(k), and the parity nodes 712(1)-712(k) may also calculate the reliability information for the message nodes 714(1)-714(n). The reliability information may be transmitted along edges in the bipartite graph 710. For example, the parity node 712(i) may transmit the reliability information $L_{i->j}$ to the message node 714(j), and the message node 714(j) may transmit the reliability information $L_{j->i}$ to the parity node 712(i). The reliability information represents the probability (i.e., the confidence level) that a data bit is decoded into "1" or "0" asserted by a node. For example, the reliability information $L_{j->i}$ represents the confidence level (may be positive or negative) that the $j^{th}$ data bit is decoded into "1" or "0" asserted at the message node 714(j), and the reliability information $L_{j->i}$ represents the confidence level that the $j^{th}$ data bit is decoded into "1" or "0" asserted at the parity node 712(i). The message nodes 714(1)-714(n) and the parity nodes 712(1)-712(k) may calculate the output reliability information based on the input reliability information. The calculation is similar to calculating of a conditional probability that a data bit is decoded into "1" or "0". Therefore, a process of transmitting the reliability information above is also referred to as a belief propagation.

In response to different algorithms, different reliability information may be calculated by the message nodes 714(1)-714(n) and the parity nodes 712(1)-712(k). For example, the ECCC 508 may use a sum-product algorithm, a min-sum algorithm, a bit-flipping algorithm and so on, which is not limited by the disclosure.

In each iteration of the iteration decoding, the message nodes 714(1)-714(n) may transmit reliability information to the parity nodes 712(1)-712(k), and the parity nodes 712(1)-712(k) may transmit reliability information to the message nodes 714(1)-714(n). After each iteration, the message nodes 714(1)-714(n) may calculate whether one data bit should be decoded to be "1" or "0". Then, a parity-check operation may be performed on the calculated data bit. For example, in the parity-check operation, the codeword formed by the data bits may be multiplied with the parity check matrix. Accordingly, the generated codeword may be determined as a valid codeword or not a valid codeword. If the generated codeword is a valid codeword, it represents that the decoding is successful and the iteration decoding may be stopped. However, if the generated codeword is not a valid codeword, it represents the decoding is failed and a next iteration may be performed. In addition, if the number of iterations of the iteration decoding reaches a predetermined value, it may be determined that the decoding is failed and the iteration decoding may be stopped correspondingly.

Figure 8:
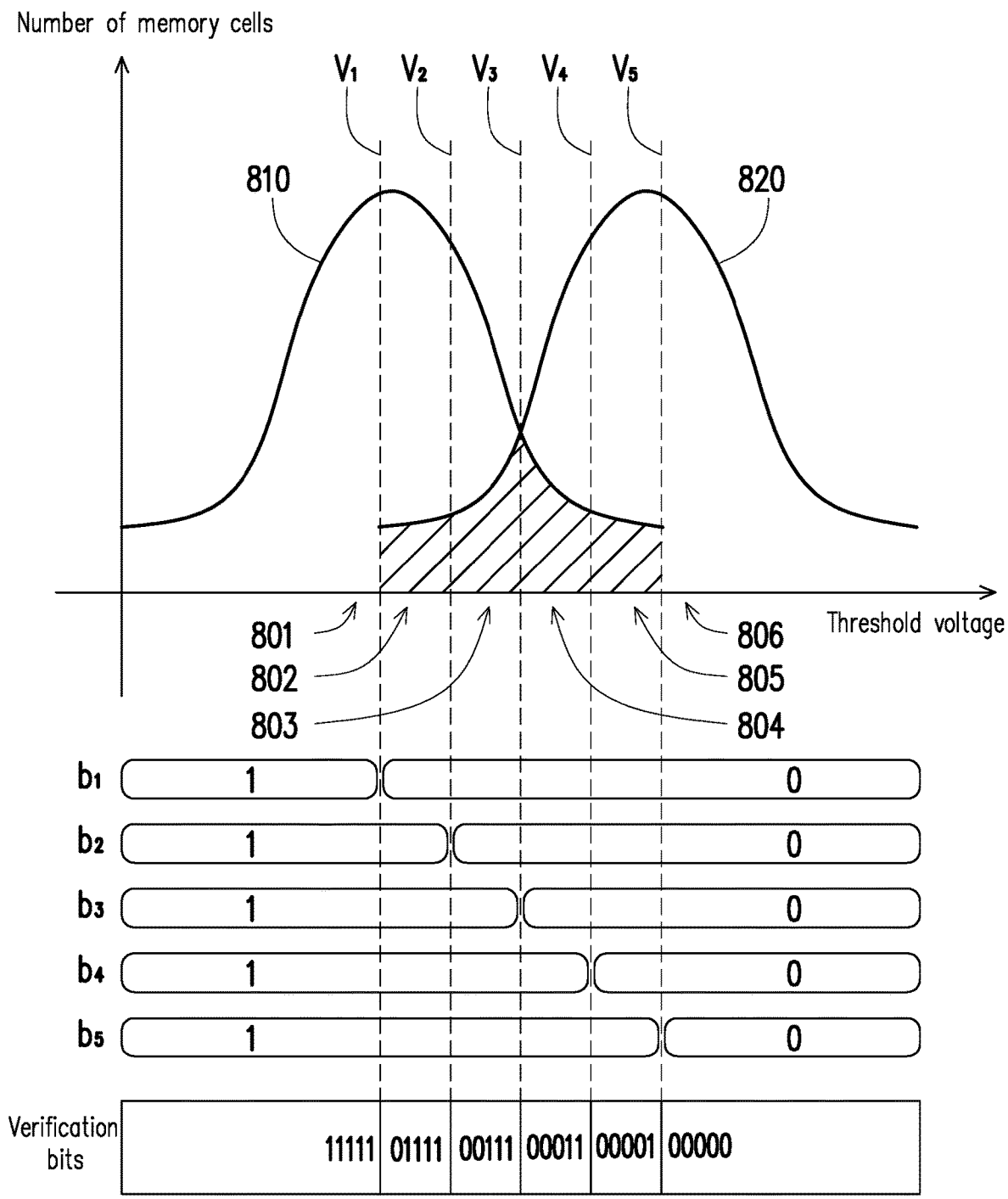
FIG. 8 is a schematic diagram of reading verification bits according to an exemplary embodiment of the disclosure.

FIG. 8 is a schematic diagram of reading verification bits according to an exemplary embodiment of the disclosure.

Referring to FIG. 8, it is assumed that a memory cell belonging to a state 810 stores bit "1" and a memory cell belonging to a state 820 stores bit "0". The states 810 and 820 may partially overlap with each other. Therefore, when the memory cells are read by some read voltage levels, some of the memory cells belonging to the state 810 may be mistakenly determined as belonging to the state 820, and/or some of the memory cells belonging to the state 820 may be mistakenly determined as belonging to the state 810. In the exemplary embodiment, it is assumed that, if a channel of a memory cell is turned on by a read voltage level, a correspondingly obtained verification bit is bit "1", and if a channel of a memory cell is not turned on by a read voltage level, a correspondingly obtained verification bit is bit "0".

The MMC 502 may send at least one read command sequence to the RNVM module 406 to instruct a reading of a PU by read voltage levels $V_1$-$V_5$. According to a reading result of reading a specific memory cell of the PU by using the reading voltage levels $V_1$-$V_5$, the MMC 502 may obtain 5 verification bits $b_1$-$b_5$. The read voltage level $V_1$ corresponds to the verification bit $b_1$. The read voltage level $V_2$ corresponds to the verification bit $b_2$. The read voltage level $V_3$ corresponds to the verification bit $b_3$. The read voltage level $V_4$ corresponds to the verification bit $b_4$. The read voltage level $V_5$ corresponds to the verification bit $b_5$.

If a threshold voltage of a specific memory cell is within a voltage range 801, then after the memory cell is read by the read voltage levels $V_1$~$V_5$, the verification bits obtained by the MMC 502 may be "11111". Similarly, if a threshold voltage of a specific memory cell is within a voltage range 802, the verification bits obtained by the MMC 502 may be "01111". If a threshold voltage of a specific memory cell is within a voltage range 803, the verification bits obtained by the MMC 502 may be "00111". If a threshold voltage of a specific memory cell is within a voltage range 804, the verification bits obtained by the MMC 502 may be "00011". If a threshold voltage of a specific memory cell is within a voltage range 805, the verification bits obtained by the MMC 502 may be "00001". If a threshold voltage of a specific memory cell is within a voltage range 806, the verification bits obtained by the MMC 502 may be "00000".

In an exemplary embodiment, the RNVM module 406 may also perform a logical operation on the verification bits $b_1$~$b_5$, and then transmit the calculated verification bits to the MMC 502. For example, an Exclusive OR (XOR) operation may be performed on the verification bits $b_2$ and $b_4$, and an XOR operation may be performed on the verification bits $b_1$ and $b_5$. As such, for the reading result of a certain memory cell, the MMC 502 may only obtain 3 verification bits, thereby reducing the amount of data which is transmitted between the MMC 502 and the RNVM module 406. However, the disclosure does not limit the number and the content of the verification bits.

In an exemplary embodiment, one of the read voltage levels $V_1$-$V_5$ may be determined as a sign read voltage level. The sign read voltage level is configured to determine a bit value of a data bit (also referred to as a hard bit). For example, if the read voltage level $V_3$ is the sign read voltage level, the determined data bit may be the same as the verification bit $b_3$. Alternatively, if the read voltage level $V_2$ is the sign read voltage level, the determined data bit may be the same as the verification bit $b_2$, and so on.

In an exemplary embodiment, the voltage ranges 801-806 correspond to specific reliability information, respectively. According to the verification bits $b_1$-$b_5$ obtained by reading a certain memory cell, the MMC 502 may determine that the threshold voltage of this memory cell is within one of the voltage ranges 801-806. For example, if the obtained verification bits are "00111", the MMC 502 may determine that the threshold voltage of this memory cell is within the voltage range 803. Then, the ECCC 508 may decode the data bit (i.e., the hard bit) read from this memory cell according to the reliability information corresponding to the voltage range 803.

In an exemplary embodiment, the reliability information includes a log likelihood ratio (LLR). According to a probability indicating that a memory cell belongs to the state 810 and/or to the state 820 within a certain voltage range, a log likelihood ratio may be obtained and determined as the reliability information corresponding to this voltage range.

In an exemplary embodiment, the log likelihood ratio for each voltage range may be calculated in advance and stored in a log likelihood ratio lookup table. The MMC 502 may generate an index according to the verification bits $b_1$-$b_5$ and input this index into the log likelihood ratio lookup table to obtain the corresponding log likelihood ratio as the reliability information.

It is noted that, the memory cells in the RNVM module 406 may be deteriorated and/or wear after the memory storage device 10 has been in use for a period of time. The deteriorated and/or wear memory cells may make the default log likelihood ratio lookup table difficult to function. For example, after severe deterioration and/or wear of one specific memory cells, the data bit read from such memory cells may not be successfully corrected by using the reliability information in the default log likelihood ratio lookup table. Therefore, in an exemplary embodiment, the MMC 502 may update the reliability information based on the decoded data (i.e., the successfully decoded data), so as to improve a decoding performance of a decoding circuit and/or prolong a lifetime of the memory storage device 10.

In an exemplary embodiment, the MMC 502 may issue at least one read command sequence (also referred to as first read command sequence) to instruct a reading of data (also referred to as first data) from a specific PU (also referred to as first PU). For example, the first PU may be one of the PPUs of FIG. 6. The ECCC 508 may decode the first data. If the first data is successfully decoded, the MMC 502 may update the reliability information based on the decoded first data.

After updating the reliability information, the MMC 502 may issue at least one read command sequence (also referred to as a second read command sequence) to instruct a reading of data (also referred to second data) from a specific PU (also referred to as second PU). For example, the second PU may also be one of the PPUs of FIG. 6. The ECCC 508 may decode the second data according to the updated reliability information. It is noted that, the updated reliability information is more in line with the current threshold voltage distribution of the memory cells. As such, the decoding performance of the ECCC 508 for the second data may be effectively improved. For example, the second data is decoded based on the updated reliability information, so the decoding time of the second data may be less than the decoding time of the first data, and/or the decoding success rate of the second data may be higher than the decoding success rate of the first data.

In an example embodiment, the MMC 502 may obtain the total number of specific memory cells (also referred to as first memory cells) in the first PU. The voltage of a first memory cell is within a specific voltage range (also referred to as first voltage range). For example, the first voltage range may be one of the voltage ranges 801-806 of FIG. 8. One of the first memory cells stores a part of the first data. For example, the MMC 502 may determine the first memory cell based on the obtained verification bits and count the total number of the first memory cells. In an example embodiment, the MMC 502 may update the reliability information corresponding to the first voltage range based on the total number. For example, the MMC 502 may adjust the reliability information corresponding to the first voltage range based on whether the total number is increased or decreased.

In an exemplary embodiment, the MMC 502 may identify a real value of a bit (also referred to as first bit) stored by the first memory cell based on the decoded first data. The real value may be obtained by decoding the first data. The real value reflects a correct bit value of the first bit stored by the first memory cell. The real value may be different from the bit value of the data bit obtained by reading the first memory cell. For example, if it is assumed that the bit value of a data bit originally read from a specific memory cell is "0" and the bit value is corrected to "1" by decoding, it indicates that the real value of the data bit stored in this memory cell is "1". In other words, the real value reflects that the memory cell is actually storing the bit value "1". Similarly, if it is assumed that the bit value of a data bit originally read from a specific memory cell is "1" and after decoding, the bit value is corrected to "0", it indicates that the real value of the first bit stored in the memory cell is "0". In other words, the real value reflects that the memory cell is actually storing the bit value "0". The MMC 502 may update the reliability information corresponding to the first voltage range according to the real value.

In an example embodiment, the MMC 502 may update the reliability information corresponding to the first voltage range based on a first bit value in the decoded first data. The first bit value is the real value and the first bit value may be "0" or "1". For example, the MMC 502 may adjust the reliability information corresponding to the first voltage range based on the total number and/or a distribution of all or at least a portion of "1" (or "0") in the decoded first data.

Taking FIG. 8 as an example, it is assumed that the first voltage range is the voltage range 803 and the threshold voltages of 200 memory cells are within the voltage range 803 (i.e., the total number of the first memory cells is 200). The MMC 502 may obtain, according to the decoded first data, information indicating that in these 200 memory cells, P1 memory cells actually store a first bit value, while P2 memory cells actually store a second bit value. If the first bit value is "1", then the second bit value is "0". Alternatively, if the first bit value is "0", then the second bit value is "1". The sum of P1 and P2 is 200.

In an exemplary embodiment, P1 is also referred to as a first number, and P2 is also referred to as a second number. P1 reflects the number of the first bit values in the decoded first data corresponding to the first voltage range. P2 reflects the number of the second bit values in the decoded first data corresponding to the first voltage range. The MMC 502 may update the reliability information corresponding to the first voltage range according to P1 and/or P2. For example, the MMC 502 may obtain new reliability information corresponding to the first voltage range based on the ratio of P1 to P2. For example, the MMC 502 may substitute P1 and P2 into a function of log (P1/P2) to obtain a log likelihood ratio. The MMC 502 may determine the log likelihood ratio as the new reliability information corresponding to the first voltage range. For example, the MMC 502 may update the reliability information corresponding to the first voltage range in the log likelihood ratio lookup table based on the new log likelihood ratio. Thereafter, the new reliability information in the log likelihood ratio lookup table may be used to decode other data to improve the decoding performance of the decoding circuit and/or to extend the lifetime of the memory storage device 10.

In an exemplary embodiment, the first PU is the same PU as the second PU. For example, the first PU and the second PU may be the same PPU 610(0) of FIG. 6. In an exemplary embodiment, the first PU and the second PU belong to the same PEU (also referred to as the first PEU) in the RNVM module 406. Taking FIG. 6 as an example, the first PU may be a PPU 610(0), and the second PU may be a PPU 610(1). The PPUs 610(0) and 610(1) both belong to the PEU 600(0). In an exemplary embodiment, the aforementioned reliability information updated according to the decoded first data is (only) used to decode data read from the same PEU.

In an exemplary embodiment, the first PU belongs to one of the PEUs (e.g., the first PEU) of the RNVM module 406, and the second PU belongs to another PEU (e.g., a second PEU) in the RNVM module 406. The first PEU is independent from the second PEU. Taking FIG. 6 as an example, the first PU may be the PPU 610(0), and the second PU may be the PPU 620(0). The PPU 610(0) belongs to the PEU 600(0). The PPU 620(0) belongs to the PEU 600(1). The PEUs 600(0) and 600(1) are independent of each other. In an exemplary embodiment, the aforementioned reliability information updated according to the decoded first data may be used to decode data read from a plurality of PEUs.

In an exemplary embodiment, a page offset of the first PU in the first PEU is the same as a page offset of the second PU in the second PEU. Therefore, the deterioration degree and/or the wear degree of the memory cells in the first PU has a higher probability of being similar to the deterioration degree and/or the wear degree of the memory cells in the second PU, thereby improving the decoding performance of the decoding circuit for the second data.

In an exemplary embodiment, the MMC 502 may obtain wear information of at least a portion of the PUs of FIG. 6. The wear information reflects the deterioration degree and/or the wear degree of memory cells in these PUs. For example, the wear information may include a write count, a read count, an erase count, and/or a bit error rate. The MMC 502 may select, according to the wear information, a plurality of PUs having the same or similar deterioration degree and/or the wear degree of memory cells from the plurality of PUs as the first PU and the second PU. For example, the wear information of the selected first PU and the second PU may belongs to the same value range. For example, if it is assumed that the write count of the first PU is 120, the MMC 502 may select a specific PU having a write count between 100 and 150 as the second PU.

It is noted that, in an exemplary embodiment of FIG. 8, the total number of the read voltage levels $V_1$-$V_5$ and the total number of the voltage ranges 801-806 may be more or less, depending on practical requirements. Furthermore, although the foregoing exemplary embodiments take an example of updating the reliability information corresponding to the voltage range 803, however, the same or similar reliability information updating operation may be applied to other voltage ranges, and the details are not repeated hereinafter. In an exemplary embodiment, the updated reliability information may also be used to decode data read from more PUs, and details are not described hereinafter.

In an example embodiment, the ECCC 508 may decode data (e.g., the first data and/or the second data) based on at least one of a hard bit mode and a soft bit mode. In an exemplary embodiment, if the total number of the read voltage level used for reading one specific memory cell is one, then the read data (i.e., the verification bit) may (only) contain a hard bit, and the ECCC 508 may decode the read data based on the hard bit mode. Taking FIG. 8 as an example, after reading the first memory cell (or the first PU) by using the read voltage level $V_3$, the obtained verification bit may include the hard bit read by the read voltage level $V_3$. The ECCC 508 may decode the read data based on the hard bit mode. However, in an exemplary embodiment, if the total number of the read voltage levels used for reading the first memory cell (or the first PU) is greater than one, then the read data (i.e., the verification bits) may include a hard bit and at least one soft bit, and the ECCC 508 may decode the read data based on the soft bit mode. Taking FIG. 8 as an example, after the first memory cell (or the first PU) is read by using the read voltage levels $V_1$-$V_5$ in sequence, the obtained verification bits may include the hard bit read by the read voltage level $V_3$ and the soft bits read by the read voltage levels $V_1$, $V_2$, $V_4$, and $V_5$. The ECCC 508 may decode the read data based on the soft bit mode.

The decoding operation performed based on the soft bit mode and the decoding operation performed based on the hard bit mode may employ the same or different decoding algorithms. In an example embodiment, the reliability information is (only) used in the soft bit mode. Therefore, the decoding success rate of the decoding operation performed based on the soft bit mode may be higher than the decoding success rate of the decoding operation performed based on the hard bit mode; however, the system power consumption (and/or algorithm complexity) of the decoding operation performed based on the soft bit mode may also be higher than the system power consumption (and/or algorithm complexity) of the decoding operation performed based on the hard bit mode. However, in another exemplary embodiment, the reliability information may be used in both of the soft bit mode and the hard bit mode.

Figure 9:
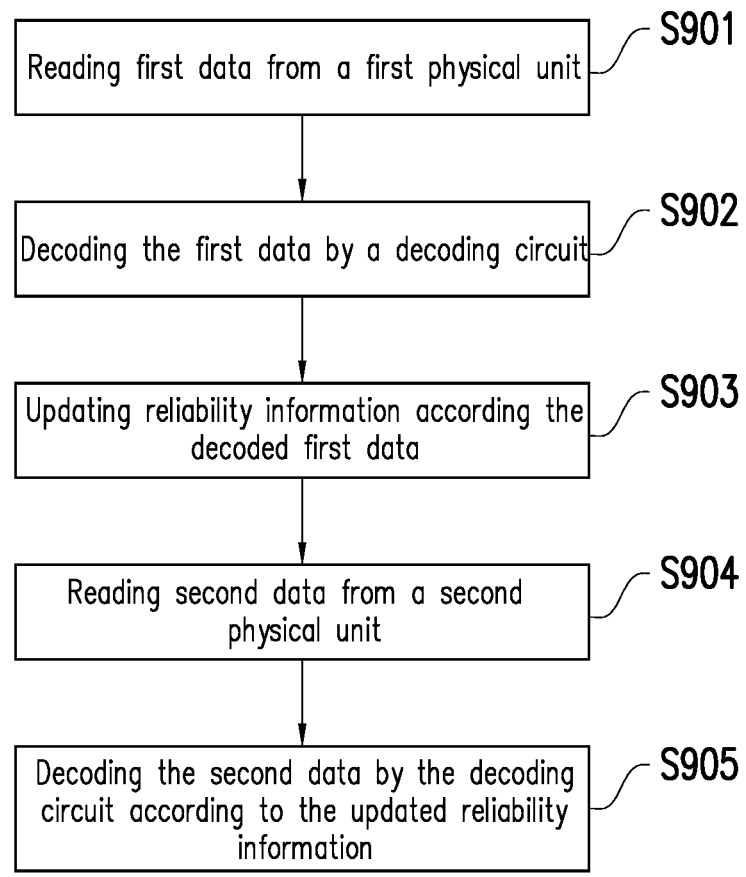
FIG. 9 is a flowchart of a memory control method according to an exemplary embodiment of the disclosure.

FIG. 9 is a flowchart of a memory control method according to an exemplary embodiment of the disclosure.

Referring to FIG. 9, in step S901, the first data is read from the first PU in the RNVM module. In step S902, the first data is decoded by the decoding circuit. In step S903, the reliability information is updated according to the decoded first data. In step S904, the second data is read from the second PU in the RNVM module. In step S905, the second data is decoded according to the updated reliability information by the decoding circuit.

However, the steps in FIG. 9 have been described in detail above and may not be reiterated here. It shall be noted that the steps in FIG. 9 may be implemented as multiple program codes or circuits, and the disclosure is not limited thereto. In addition, the methods of FIG. 9 may be used in combination with the embodiments above or may be used alone, and the disclosure is not limited thereto.

Based on the above, after the first data is read from the first PU, the first data may be decoded, and the reliability information may be updated according to the decoded first data. After the second data is read from the second PU, the second data may be decoded according to the updated reliability information. Accordingly, a decoding efficiency of a decoding circuit, a memory storage device and/or a memory control circuit unit may be improved, and a lifetime of a memory storage device may be extended.

The previously described exemplary embodiments of the present disclosure have the advantages aforementioned, wherein the advantages aforementioned not required in all versions of the disclosure.

It may be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory control method, for a rewritable non-volatile memory module, wherein the rewritable non-volatile memory module comprises a plurality of physical units, and the memory control method comprises:
    reading first data from a first physical unit among the physical units;
    decoding the first data by a decoding circuit;
    updating reliability information corresponding to a first voltage range according to the decoded first data, wherein the first voltage range is one of a plurality of voltage ranges identified by a plurality of voltage levels;
    reading second data from a second physical unit among the physical units; and
    decoding data comprised in the second data by the decoding circuit according to the updated reliability information, wherein the data decoded according to the updated reliability information is data read from at least one memory cell having a voltage within the first voltage range.

2. The memory control method according to claim 1, wherein the step of updating the reliability information according to the decoded first data comprises:
    updating reliability information corresponding to the first voltage range according to a first bit value in the decoded first data,
    wherein the first bit value is one of 0 and 1.

3. The memory control method according to claim 2, wherein the step of updating the reliability information corresponding to the first voltage range according to the first bit value of the decoded first data comprises:
    obtaining a first number of the first bit value corresponding to the first voltage range in the decoded first data; and
    updating the reliability information corresponding to the first voltage range according to the first number.

4. The memory control method according to claim 3, wherein the step of updating the reliability information corresponding to the first voltage range according to the first number comprises:
    obtaining a second number of a second bit value corresponding to the first voltage range in the decoded first data, wherein the second bit value is another one of 0 and 1; and
    updating reliability information corresponding to the first voltage range according to the first number and the second number.

5. The memory control method according to claim 1, wherein the step of updating the reliability information according to the decoded first data comprises:
    identifying a real value of a first bit stored by a first memory cell in the first physical unit according to the decoded first data, wherein a voltage of the first memory cell is within the first voltage range, and a part of the first data is stored in the first memory cell; and
    updating reliability information corresponding to the first voltage range according to the real value.

6. The memory control method according to claim 1, wherein the step of updating the reliability information according to the decoded first data comprises:
    obtaining a total number of a first memory cell in the first physical unit, wherein a voltage of the first memory cell is within the first voltage range, and a part of the first data is stored in the first memory cell; and
    updating reliability information corresponding to the first voltage range according to the total number.

7. The memory control method according to claim 1, wherein the first physical unit and the second physical unit are both belonging to a first physical erasing unit in the rewritable non-volatile memory module.

8. The memory control method according to claim 1, wherein the first physical unit is belonging to a first physical erasing unit in the rewritable non-volatile memory module, the second physical unit is belonging to a second physical erasing unit in the rewritable non-volatile memory module, and the first physical erasing unit is independent from the second physical erasing unit.

9. A memory storage device, comprising:
    a connection interface unit, configured to connect a host system;
    a rewritable non-volatile memory module which comprises a plurality of physical units; and
    a memory control circuit unit, coupled to the connection interface unit and the rewritable non-volatile memory module,
    wherein the memory control circuit unit is configured to issue a first read command sequence which instructs a reading of first data from a first physical unit among the physical units,
    the memory control circuit unit is further configured to decode the first data,
    the memory control circuit unit is further configured to update reliability information corresponding to a first voltage range according to the decoded first data, wherein the first voltage range is one of a plurality of voltage ranges identified by a plurality of voltage levels,
    the memory control circuit unit is further configured to issue a second read command sequence which instructs a reading of second data from a second physical unit among the physical units, and
    the memory control circuit unit is further configured to decode data comprised in the second data according to the updated reliability information, wherein the data decoded according to the updated reliability information is data read from at least one memory cell having a voltage within the first voltage range.

10. The memory storage device according to claim 9, wherein the operation of updating the reliability information according to the decoded first data by the memory control circuit unit comprises:
    updating reliability information corresponding to the first voltage range according to a first bit value in the decoded first data,
    wherein the first bit value is one of 0 and 1.

11. The memory storage device according to claim 10, wherein the operation of updating the reliability information corresponding to the first voltage range according to the first bit value of the decoded first data by the memory control circuit unit comprises:

obtaining a first number of the first bit value corresponding to the first voltage range in the decoded first data; and updating the reliability information corresponding to the first voltage range according to the first number.

12. The memory storage device according to claim 11, wherein the operation of updating the reliability information corresponding to the first voltage range according to the first number by the memory control circuit unit comprises:

obtaining a second number of a second bit value corresponding to the first voltage range in the decoded first data, wherein the second bit value is another one of 0 and 1; and updating reliability information corresponding to the first voltage range according to the first number and the second number.

13. The memory storage device according to claim 9, wherein the operation of updating the reliability information according to the decoded first data by the memory control circuit unit comprises:

identifying a real value of a first bit stored by a first memory cell in the first physical unit according to the decoded first data, wherein a voltage of the first memory cell is within the first voltage range, and a part of the first data is stored in the first memory cell; and updating reliability information corresponding to the first voltage range according to the real value.

14. The memory storage device according to claim 9, wherein the operation of updating the reliability information according to the decoded first data by the memory control circuit unit comprises:

obtaining a total number of a first memory cell in the first physical unit, wherein a voltage of the first memory cell is within the first voltage range, and a part of the first data is stored in the first memory cell; and updating reliability information corresponding to the first voltage range according to the total number.

15. The memory storage device according to claim 9, wherein the first physical unit and the second physical unit are both belonging to a first physical erasing unit in the rewritable non-volatile memory module.

16. The memory storage device according to claim 9, wherein the first physical unit is belonging to a first physical erasing unit in the rewritable non-volatile memory module, the second physical unit is belonging to a second physical erasing unit in the rewritable non-volatile memory module, and the first physical erasing unit is independent from the second physical erasing unit.

17. A memory control circuit unit for controlling a rewritable non-volatile memory module comprising a plurality of physical units, and the memory control circuit unit comprising:

a host interface configured to couple to a host system;
a memory interface, configured to couple to the rewritable non-volatile memory module;
a decoding circuit; and
a memory management circuit, coupled to the host interface, the memory interface and the decoding circuit,
wherein the memory management circuit is configured to issue a first read command sequence which instructs a reading of first data from a first physical unit among the physical units,
the decoding circuit is configured to decode the first data, the memory management circuit is further configured to update reliability information corresponding to a first voltage range according to the decoded first data, wherein the first voltage range is one of a plurality of voltage ranges identified by a plurality of voltage levels, the memory management circuit is further configured to issue a second read command sequence which instructs a reading of second data from a second physical unit among the physical units, and the decoding circuit is further configured to decode data comprised in the second data according to the updated reliability information, wherein the data decoded according to the updated reliability information is data read from at least one memory cell having a voltage within the first voltage range.

18. The memory control circuit unit according to claim 17, wherein the operation of updating the reliability information according to the decoded first data by the memory management circuit comprises:

updating reliability information corresponding to the first voltage range according to a first bit value in the decoded first data, wherein the first bit value is one of 0 and 1.

19. The memory control circuit unit according to claim 18, wherein the operation of updating the reliability information corresponding to the first voltage range according to the first bit value of the decoded first data by the memory management circuit comprises:

obtaining a first number of the first bit value corresponding to the first voltage range in the decoded first data; and updating the reliability information corresponding to the first voltage range according to the first number.

20. The memory control circuit unit according to claim 19, wherein the operation of updating the reliability information corresponding to the first voltage range according to the first number by the memory management circuit comprises:

obtaining a second number of a second bit value corresponding to the first voltage range in the decoded first data, wherein the second bit value is another one of 0 and 1; and updating reliability information corresponding to the first voltage range according to the first number and the second number.

21. The memory control circuit unit according to claim 17, wherein the operation of updating the reliability information according to the decoded first data by the memory management circuit comprises:

identifying a real value of a first bit stored by a first memory cell in the first physical unit according to the decoded first data, wherein a voltage of the first memory cell is within the first voltage range, and a part of the first data is stored in the first memory cell; and updating reliability information corresponding to the first voltage range according to the real value.

22. The memory control circuit unit according to claim 17, wherein the operation of updating the reliability information according to the decoded first data by the memory management circuit comprises:

obtaining a total number of a first memory cell in the first physical unit, wherein a voltage of the first memory cell is within the first voltage range, and a part of the first data is stored in the first memory cell; and updating reliability information corresponding to the first voltage range according to the total number.

23. The memory control circuit unit according to claim 17, wherein the first physical unit and the second physical unit are both belonging to a first physical erasing unit in the rewritable non-volatile memory module.

24. The memory control circuit unit according to claim 17, wherein the first physical unit is belonging to a first physical erasing unit in the rewritable non-volatile memory module, the second physical unit is belonging to a second physical erasing unit in the rewritable non-volatile memory module, and the first physical erasing unit is independent from the second physical erasing unit.

* * * * *